United States Patent [19]
McCord et al.

[11] Patent Number: 4,992,728
[45] Date of Patent: Feb. 12, 1991

[54] ELECTRICAL PROBE INCORPORATING SCANNING PROXIMITY MICROSCOPE

[75] Inventors: Mark A. McCord, Mohegan Lake; Leonard Berenbaum, Hopewell Junction, both of N.Y.

[73] Assignee: International Business Machines Corporation, Armonk, N.Y.

[21] Appl. No.: 454,677

[22] Filed: Dec. 21, 1989

[51] Int. Cl.⁵ ...................... G01R 31/00; H01J 37/26
[52] U.S. Cl. ............................ 324/158 P; 324/158 R; 324/73.1; 250/306; 250/307
[58] Field of Search ............ 324/158 P, 158 F, 158 R, 324/73.1; 250/306, 307, 492.2, 423 F

[56] References Cited

U.S. PATENT DOCUMENTS

| Re. 32,457 | 7/1987 | Matey | 250/307 |
|---|---|---|---|
| 4,267,507 | 5/1981 | Guerpont | 324/158 P |
| 4,481,616 | 11/1984 | Matey | 358/342 |
| 4,724,318 | 2/1988 | Binnig | 250/306 |
| 4,806,755 | 2/1989 | Duerig et al. | 250/306 |
| 4,814,622 | 3/1989 | Gregory et al. | 250/306 |
| 4,837,435 | 6/1989 | Sakuhara et al. | 250/306 |

OTHER PUBLICATIONS

Czaka et al., "Optical Transparent Tip for Tunneling Microscope", IBM Technical Disclosure Bulletin, vol. 30, No. 5, Oct. 1987, pp. 369-370.

Davison et al., "New Symmetric Scanning Tunnel Desing", J. Vac. Sci. Technol. A, vol. 6, No. 2, Mar./Apr. 1988, pp. 380-382.

Binnig et al., "Single Tube Three Dimensional Scanner for Scanning Tunneling Microcopy", Rev. Sci. Instrum., 57(8), Aug. 1986, pp. 1688-1689.

Primary Examiner—Kenneth Wieder
Assistant Examiner—Vinh P. Nguyen
Attorney, Agent, or Firm—Pollock, Vande Sande & Priddy

[57] ABSTRACT

An electrical probe which incorporates a scanning proximity microscope for probing the sub-micron features of an integrated circuit. An optical microscope is provided to find the general region of interest, and a piezoelectric tube scanner which controls the position of the probe is disposed at an acute angle to the substrate, so as not to obscure the view of the optical microscope. A number of such probes may be located around the integrated circuit.

9 Claims, 1 Drawing Sheet

ELECTRICAL PROBE INCORPORATING SCANNING PROXIMITY MICROSCOPE

TECHNICAL FIELD

The present invention is directed to an electrical probe for an integrated circuit which is capable of contacting sub-micron features.

BACKGROUND OF THE INVENTION

In the manufacture and testing of integrated circuits, it is necessary to use electrical probes to contact the circuit for various reasons including characterization of features and failure analysis. However, while many integrated circuits presently have sub-micron features, state of the art probe heads are limited to feature sizes of one micron or greater. This is due to the fact that both the optical microscopes used in conventional probe arrangements as well as the micrometer screws which are used to position the conventional probe tips are so limited.

Scanning proximity microscopes are known in the prior art, and are capable of imaging the surface of a substrate with atomic resolution. The scanning tunneling microscope is based on the principle that when two conductors are placed very close to each other, and a potential difference is applied therebetween, the electron clouds of the atoms on the respective surfaces closest to each other will touch and a tunnel current flows across the gap. In a scanning tunneling microscope, a conductive tip is scanned across a substrate, and since the magnitude of the tunneling current is dependent on the distance between the tip and the substrate, a correction signal is generated and is used to control the tunneling distance. The correction signal is plotted against physical position to provide the location of features.

A disadvantage of the scanning tunneling microscope is that both the tunnel tip and the surface being inspected must be made of conductive material. The atomic force microscope does not have this limitation, and is comprised of a small spring having a pointed tip which when brought very close to a substrate will be slightly deflected by the interatomic forces which occur between the two bodies, the magnitude of which is dependent on the distance therebetween. The deflection of the spring is measured by a tunnel tip which is spaced a small distance from the spring, a correction signal being developed as described above, and being plotted against physical position on the substrate. An atomic force microscope of this type is disclosed in Binnig U.S. Pat. No. 4,724,318, which is incorporated herein by reference.

While the atomic force microscope provides signals which correspond to the height of a substrate, there is no effective way in the prior art in which particular sub-micron features can be contacted by an electrical probe.

SUMMARY OF THE INVENTION

It is thus the object of the present invention to provide a probe which is capable of contacting the sub-micron features of an integrated circuit.

In accordance with the invention, a probe for electrically contacting the sub-micron features of an integrated circuit which incorporates a scanning proximity microscope is provided. The scanning proximity microscope includes a conductive tip element which may be moved into contact with a portion of the integrated circuit which has been identified, and thus also serves as the probe element. External electrical equipment is connected to the tip element, so as to perform the necessary electrical measuring and testing. Additionally, an optical microscope is mounted over the substrate to find the general area of interest on the integrated circuit. In the preferred embodiment, the scanning proximity microscope is then scanned over the region of interest to find the desired circuit line, whereupon the tip is moved into electrical contact with the line. Further, scanning is effected by means of a piezoelectric tube which is positioned at an acute angle to the substrate so as not to obscure the field of view of the optical microscope. Thus, several of the atomic force microscopes can be positioned around the sample, and their tips can be clearly imaged by the optical microscope which is positioned vertically over the sample. The tunneling element of the proximity microscope arrangement is mounted on a piezoelectric bimorph for movement relative to the conductive tip element.

BRIEF DESCRIPTION OF THE DRAWINGS

The invention will be better understood by referring to the accompanying drawings, wherein.

DESCRIPTION OF THE PREFERRED EMBODIMENT

Figure 1:
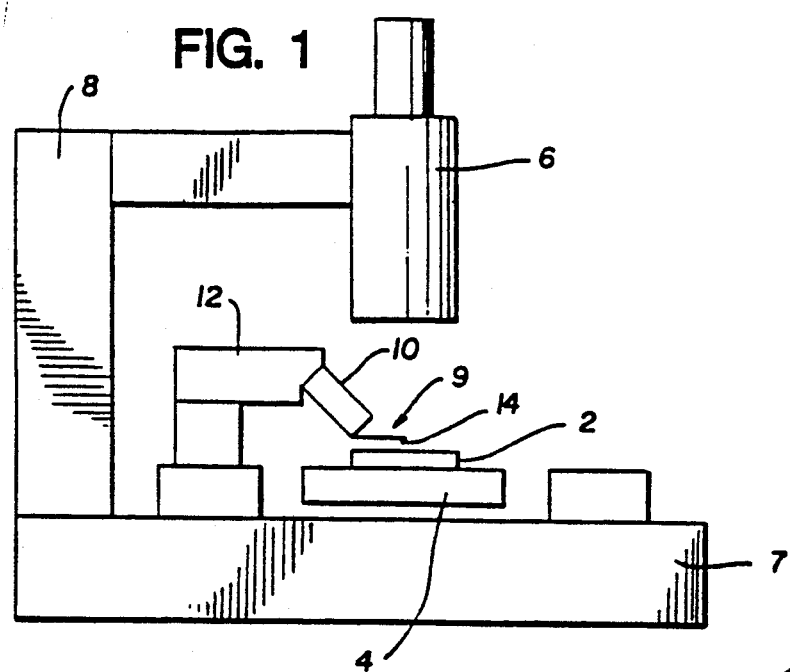
FIG. 1 is a pictorial representative of an embodiment of the invention.

Referring to FIG. 1, a pictorial representation of the probe is shown. Integrated circuit 2, which includes sub-micron features, is to be tested by electrically probing such features. As mentioned, in the prior art, this could not effectively be done since both optical microscopes and the micrometer adjustments which are used to position conventional probes are limited to sizes of one micron or greater.

Substrate 2, which is located on x-y table 4, is within the field of view of optical microscope 6. The optical microscope, which is affixed to base 7 by support 8 is used to locate the general region in which the desired feature is disposed, and then atomic force microscope 9 is used to pinpoint the location of the feature. Piezoelectric scanner 10, which is affixed to base 7 via support 12 is disposed at a 45 degree angle to the substrate 2 so as not to obscure the field of view of the optical microscope. In fact, the arrangement of the invention allows several of the atomic force microscopes to be simultaneously deployed on the integrated circuit while their tips can be clearly imaged by the optical microscope. After a circuit feature is located, probe tip 14 is moved in the z direction to contact the feature, whereupon the desired testing is performed.

Figure 2:
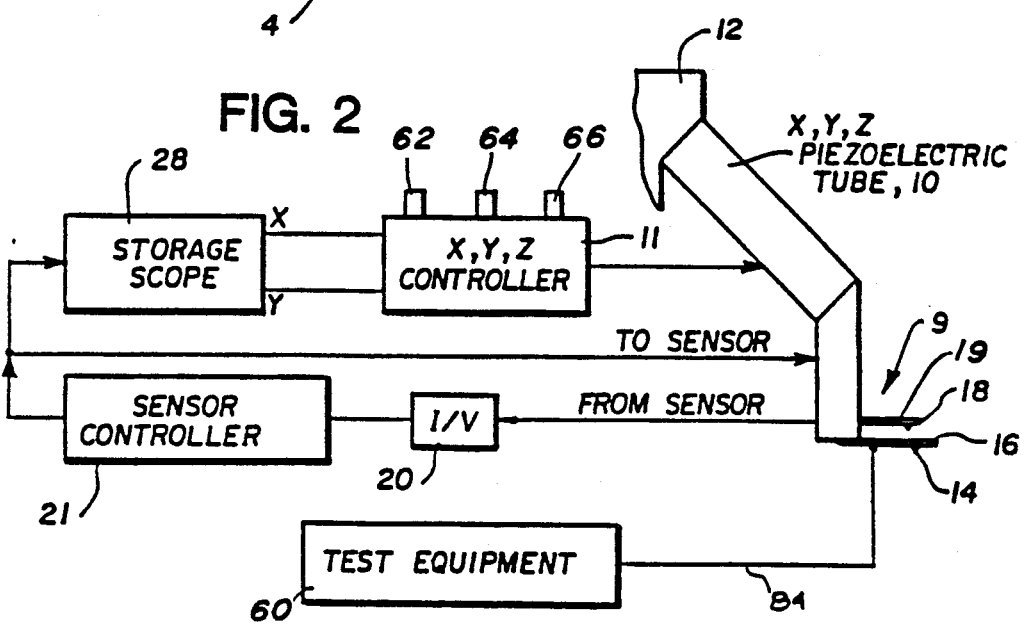
FIG. 2 shows the probe corresponding to an embodiment of the invention in greater detail.

FIG. 2 shows an embodiment of the invention in greater detail. The atomic force microscope is comprised of cantilevered spring 16 having conductive tip element 14 thereon. For example, the spring can consist of a thin, gold foil of 25 microns thickness and 0.8 mm length, whereupon an observed deflection of 40 pm would correspond to a force on the order of $10^{-10}$N. The tip element may be made of gold.

When tip element 14 is scanned across the surface of substrate 2, variations in the height of the substrate will cause the interatomic force between the tip element and the substrate to vary, thereby causing the spring 16 to deflect by varying amounts. This deflection is measured with the aid of tunneling displacement sensor 18, as follows.

Since tunneling displacement sensor 18 is located a very small distance from spring 16, the electron clouds surrounding the atom of the respective bodies touch, and a tunnel current flows between the two bodies, which is dependent on the distance therebetween. Thus, when spring 16 moves in relation to sensor 18, the tunnel current changes. This tunnel current is fed to current/voltage converter 20 . which converts the current to a voltage, which is fed to controller 21, which generates a correction signal which is fed back to the piezoelectric bimorph on which sensor 18 is disposed. This correction signal causes the sensor 18 to move so as to maintain a constant distance from spring 16. Additionally, the correction signal is used as a measure of the height of the surface of substrate 2, and is fed to storage oscilloscope 28 or other display means, which displays the correction signal as a function of substrate position.

The piezoelectric bimorph 19 moves the tunneling displacement sensor 18 in the z direction in the following way. As known to those skilled in the art, the bimorph is comprised of two piezoelectric plates, one of which expands and one of which contracts when a voltage is applied. The net result of this is that the bimorph bends, thus moving the sensor 18 in the z direction.

Figure 3:
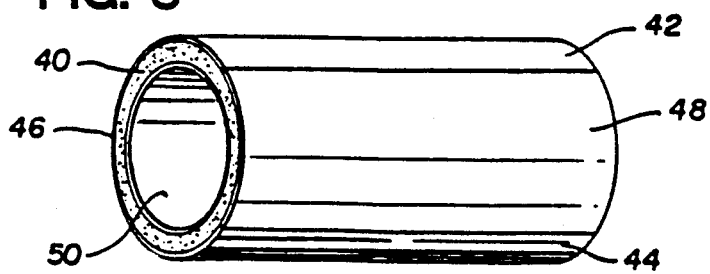
FIG. 3 shows the piezoelectric tube scanner in greater detail.

The piezoelectric tube 10 is supplied with signals from x, y, z controller 11, and is used to scan the tip element 14 in the x and y directions, as well as to move it in the z direction when it is desired for the probe to contact a circuit feature. Referring to FIG. 3, the piezoelectric tube is shown in greater detail, and is seen to be comprised of a tube 40 of piezoelectric material, and several electrodes. The outside is divided into four sections 42, 44, 46 and 48, while there is a single inner electrode 50.

By applying a voltage, (whose sign depends upon the polarization of the piezoelectric material), to a single outside electrode, that segment of the tube is made to expand perpendicular to the electric field. This causes the whole tube to bend perpendicular to its axis. Orthogonal x-y motion is obtained by controlling the voltages on two of the electrodes spaced 90° apart. The other two electrodes can be grounded or used as large amplitude offsets by applying a high d.c. voltage. Motion in the z direction is obtained by applying voltage to the single inside electrode which causes a uniform expansion of the tube.

Thus referring to the Figure, electrodes 42 and 44 are the x displacement a.c. and d.c. electrodes respectively, electrodes 46 and 48 are the y displacement a.c. and d.c. electrodes respectively, while inner electrode 50 is the z displacement electrode. For a detailed description of the operation of the piezoelectric tube, see 'Single-Tube Three Dimensional Scanner For Scanning Tunneling Microscope' by Binnig & Smith, Rev. Sci. Instrum 57(8) August, 1986, P. 1688 et al.

As previously described, scanning tube 10 is oriented at about a 45 angle to the substrate, and thus the x, y, and z control signals to the tube must be accordingly scaled. As known to those skilled in the art, this transformation is easily accomplished, and may be effected by a resistance matrix which is included in the controlling electronics .

In the use of the present invention, optical microscope 6 is used to locate the general area of the feature to be tested, and in this regard x-y table 4 is movable under the microscope so that the feature is within a few microns of the probe. Then xyz controller 11 then generates a signal which is used to scan tip element 14 over the local region via piezoelectric tube 10. The height of the surface of the local region scanned is displayed by storage oscilloscope 28 or other display means such as a plotter.

When the desired feature is discerned, tip element 14 is brought directly over it, for example by manipulating manual x,y controls 62, 64 of controller 11. Then, tip element 14, is lowered, for example by manipulating manual z control 66 of controller 11, so that contact with the circuit feature is made.

Tip element 14 has an electrical lead 84 connected to it, for being connected to external test equipment 60. Thus, the probe of the invention is connectable to test equipment for performing necessary electrical testing of sub-micron features.

Additionally, as has been previously mentioned, in accordance with the configuration of the invention, it is possible to use a number of such probes on an integrated circuit for simultaneously probing different features.

While the invention has been illustrated in connection with an embodiment utilizing an atomic force microscope, it should be understood that other types of scanning proximity microscopes, e.g., scanning tunnel microscopes and scanning thermal microscopes may also be used. It therefore should be appreciated that while the invention has been disclosed in connection with illustrative embodiments, it is to be limited only by the claims appended hereto and equivalents.

Having thus described our invention, what we claim as new and desire to secure by Letters Patent is:

1. A probe for identifying and electrically contacting sub-micron features of a substrate, comprising,
  a scanning proximity microscope which includes,
  (a) a conductive tip element which is arranged for movement adjacent a substrate,
  (b) means for generating a signal which corresponds to differences in the distance between said tip element and said substrate as said tip element is moved, and
  (c) means for displaying said signal so as to allow identification of portions of said substrate/ means for electrically connecting external equipment with said conductive tip element, and means for moving said conductive tip element into contact with a portion of said substrate which has been identified.

2. The probe of claim 1 wherein said scanning proximity microscope is an atomic force microscope.

3. The probe of claim 2 further including means for causing said conductive tip element to be scanned over said substrate.

4. The probe of claim 3 further including an optical microscope which is mounted so as to be over said substrate, and wherein said means for causing said tip element to be scanned over said substrate comprises a member which is mounted so as to be aligned at an acute angle to said substrate so as not to obscure the field of view of said optical microscope.

5. The probe of claim 4 wherein said means for causing said tip element to be scanned comprises a piezoelectric tube which is arranged for bending movement in mutually perpendicular directions responsive to respective electrical signals.

6. A probe for contacting sub-micron features of a substrate which includes an atomic force microscope, comprising,
an atomic force microscope which includes
(a) a displaceable spring member having a conductive tip element and being arranged for movement adjacent a substrate,
(b) a tunneling displacement sensor spaced from said conductive tip element,
(c) means for moving said tunneling displacement sensor relative to said conductive tip element as the distance between said tip element and said substrate changes, and
(d) means for generating a signal corresponding to the movement of said tunneling displacement sensor, means for connecting external electrical equipment with said conductive tip element, and means for moving said conductive tip element into contact with a portion of said substrate.

7. The probe of claim 6 wherein said means for moving said tunneling displacement sensor comprises a piezoelectric bimorph on which said sensor is mounted.

8. The probe of claim 7 further including an optical microscope which is located over said substrate.

9. The probe of claim 8 further including means for scanning said spring and conductive tip element over said substrate, which comprises a piezoelectric tube which is mounted so as to be aligned at an acute angle to said substrate and which is arranged for bending movement in mutually perpendicular directions responsive to respective electrical signals.

* * * * *